(12) United States Patent
Kim et al.

(10) Patent No.: US 10,847,724 B2
(45) Date of Patent: Nov. 24, 2020

(54) ORGANIC SOLAR CELL MODULE AND METHOD FOR MANUFACTURING SAME

(71) Applicant: LG CHEM, LTD., Seoul (KR)

(72) Inventors: Younshin Kim, Daejeon (KR); Jaechol Lee, Daejeon (KR); Hangken Lee, Daejeon (KR); Songrim Jang, Daejeon (KR); Doowhan Choi, Daejeon (KR)

(73) Assignee: LG Chem, Ltd., Seoul (KR)

( * ) Notice: Subject to any disclaimer, the term of this patent is extended or adjusted under 35 U.S.C. 154(b) by 294 days.

(21) Appl. No.: 15/739,078

(22) PCT Filed: Mar. 28, 2017

(86) PCT No.: PCT/KR2017/003347
§ 371 (c)(1),
(2) Date: Dec. 21, 2017

(87) PCT Pub. No.: WO2017/171364
PCT Pub. Date: Oct. 5, 2017

(65) Prior Publication Data
US 2018/0182963 A1 Jun. 28, 2018

(30) Foreign Application Priority Data
Mar. 28, 2016 (KR) .................. 10-2016-0037174

(51) Int. Cl.
*H01L 51/00* (2006.01)
*H01L 31/18* (2006.01)
*H01L 27/30* (2006.01)
*H01L 51/42* (2006.01)
*H01L 51/44* (2006.01)

(52) U.S. Cl.
CPC ........ *H01L 51/0023* (2013.01); *H01L 27/301* (2013.01); *H01L 51/4253* (2013.01); *H01L 51/441* (2013.01); *Y02E 10/549* (2013.01)

(58) Field of Classification Search
CPC ............. H01L 51/0023; H01L 51/0021; H01L 51/0019; H01L 51/0017; H01L 51/0015;
(Continued)

(56) References Cited

U.S. PATENT DOCUMENTS

2011/0304002 A1   12/2011 Niira
2012/0031459 A1*   2/2012 Kim ................... H01L 31/046
                                                              136/244
(Continued)

FOREIGN PATENT DOCUMENTS

CN    103192596 A  *  7/2013
JP    H02-71566        3/1990
(Continued)

OTHER PUBLICATIONS

Sung An Machinery Co, KR101539959 English machine translation (Year: 2015).*

(Continued)

*Primary Examiner* — Susan D Leong
(74) *Attorney, Agent, or Firm* — Myers Bigel, P.A.

(57) ABSTRACT

The present invention relates to a manufacturing method of an organic solar cell module and an organic solar cell module, and more particularly, to an organic solar cell module and a manufacturing method thereof, in which lower electrodes are spaced and etched in a staggered pattern and upper electrodes are coated to correspond to the lower electrodes to reduce a photoactive area of a sub cell and arrange more sub cells than sub cells in the related art in a predetermined area. Further, the present invention relates to an organic solar cell module and a manufacturing method thereof, which can reduce the installation cost and the manufacturing cost by coating a buffer layer and a photoactive layer on the lower electrode etched in the staggered pattern using a slot die coating apparatus in the related art.

9 Claims, 5 Drawing Sheets

(58) Field of Classification Search
CPC ... H01L 51/4253; H01L 51/441; H01L 51/56; H01L 27/142; H01L 31/18; H01L 31/0352; H01L 31/0463; H01L 31/1888
See application file for complete search history.

(56) References Cited

U.S. PATENT DOCUMENTS

| | | |
|---|---|---|
| 2012/0186625 A1 | 7/2012 | Jee |
| 2014/0261674 A1 | 9/2014 | Youngbull et al. |
| 2015/0380465 A1 | 12/2015 | Huang et al. |
| 2015/0380670 A1 | 12/2015 | Aoki |
| 2016/0013410 A1 | 1/2016 | Lafalce et al. |

FOREIGN PATENT DOCUMENTS

| | | |
|---|---|---|
| JP | 10233517 | 9/1998 |
| JP | 2011124494 | 6/2011 |
| JP | 2014175380 | 9/2014 |
| JP | 2014192196 | 10/2014 |
| KR | 10-2010-0010407 | 2/2010 |
| KR | 10-2011-0035799 | 4/2011 |
| KR | 1020110035799 | 4/2011 |
| KR | 1020110036170 A | 4/2011 |
| KR | 1020110060601 A | 6/2011 |
| KR | 10-1080895 | 11/2011 |
| KR | 10-2013-0033803 | 4/2013 |
| KR | 10-2013-0142706 | 12/2013 |
| KR | 101539959 | 7/2015 |
| WO | 2010/098467 | 9/2010 |
| WO | 2013137274 | 9/2013 |

OTHER PUBLICATIONS

Extended European Search Report corresponding to European Patent Application No. 17775788.7 dated Aug. 23, 2018. (6 pages).

* cited by examiner

[Figure 1]
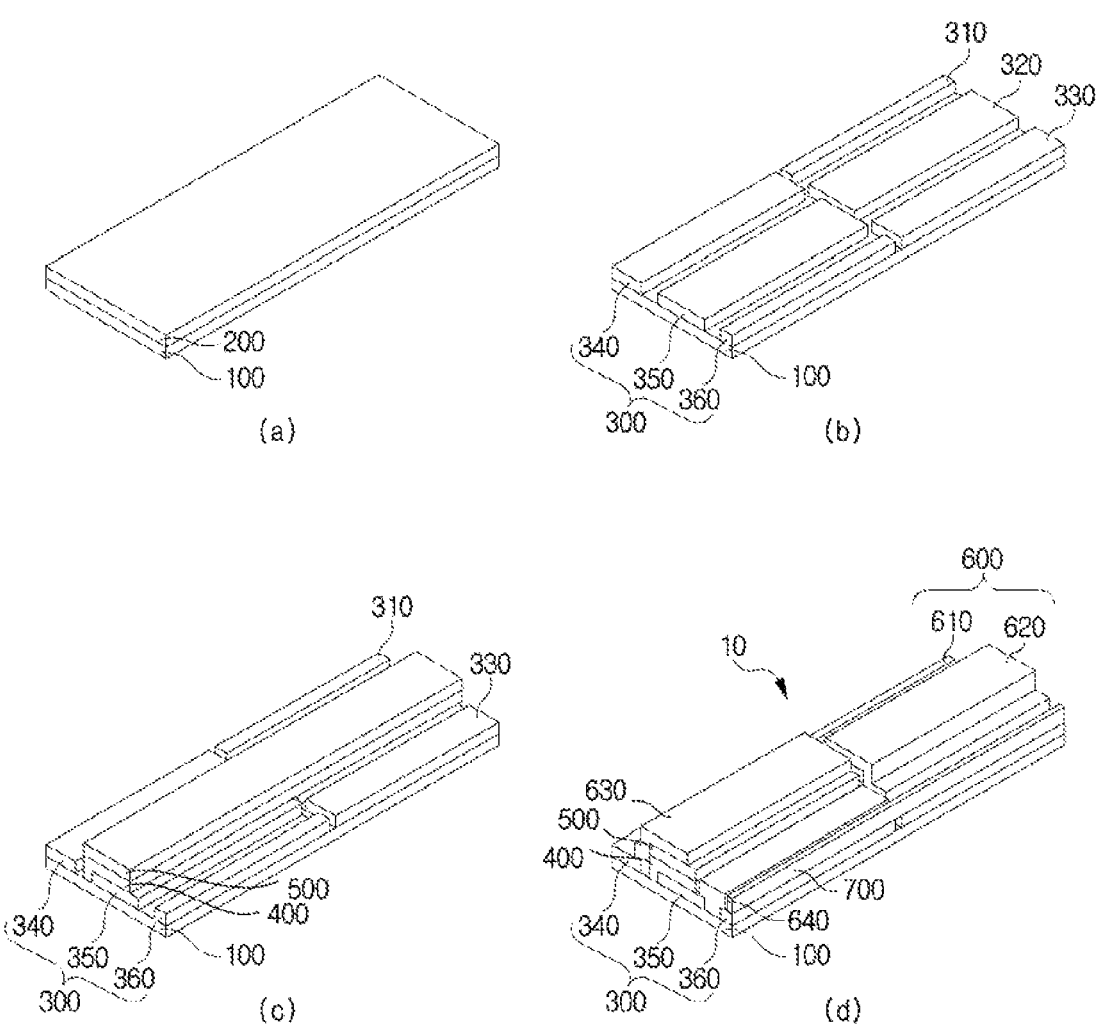

[Figure 2]
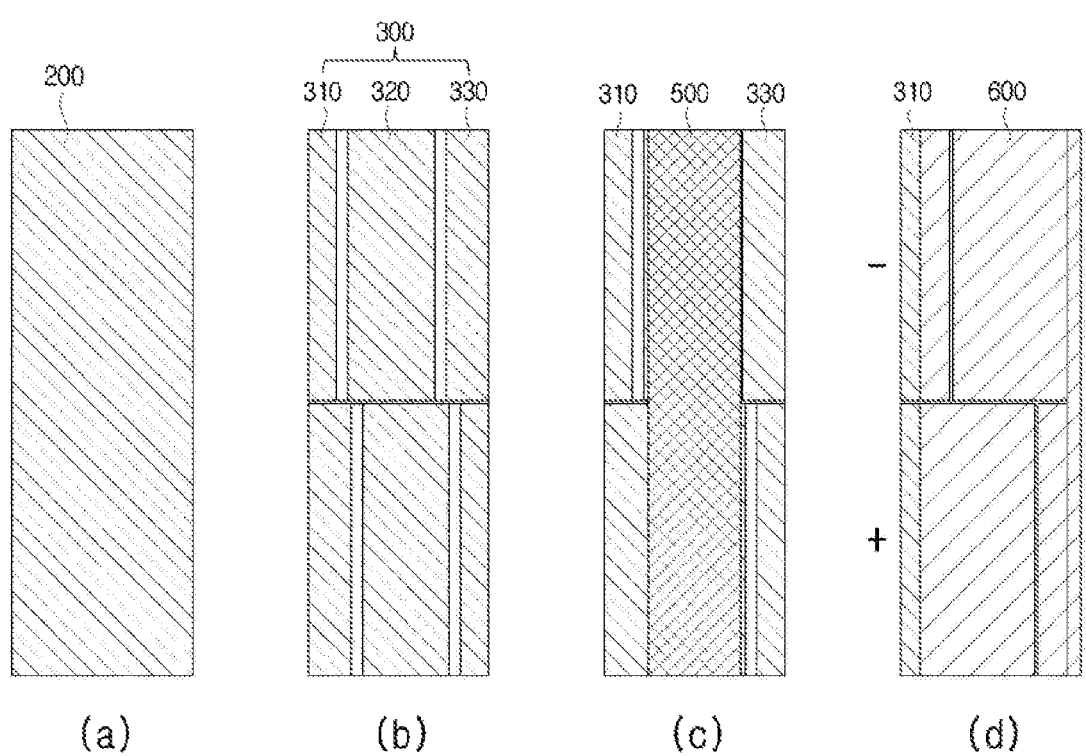

[Figure 3]
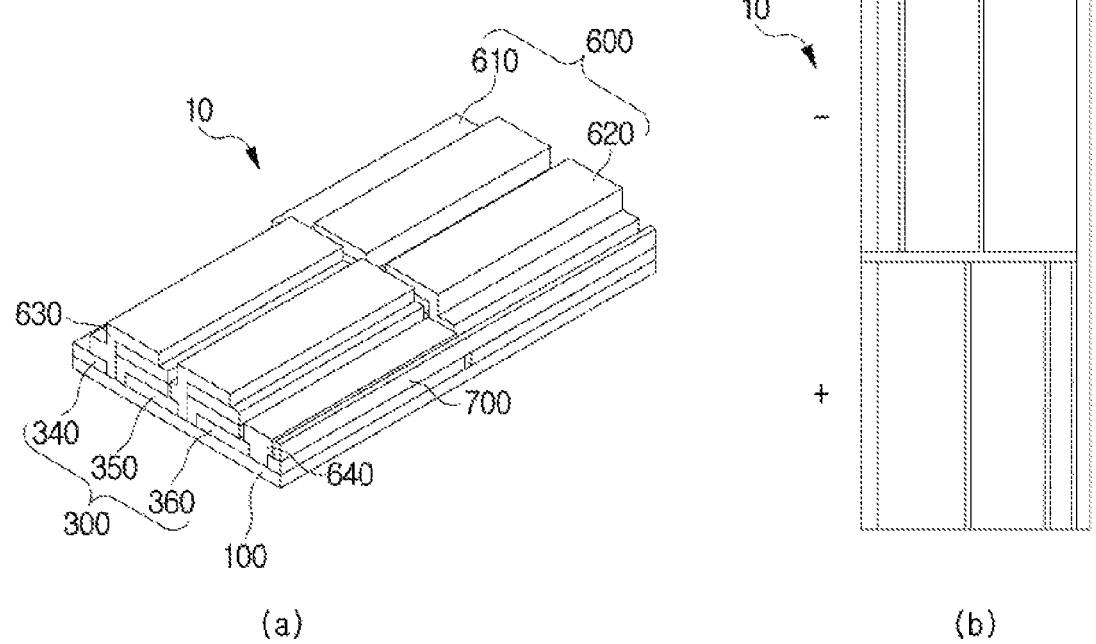

[Figure 4]
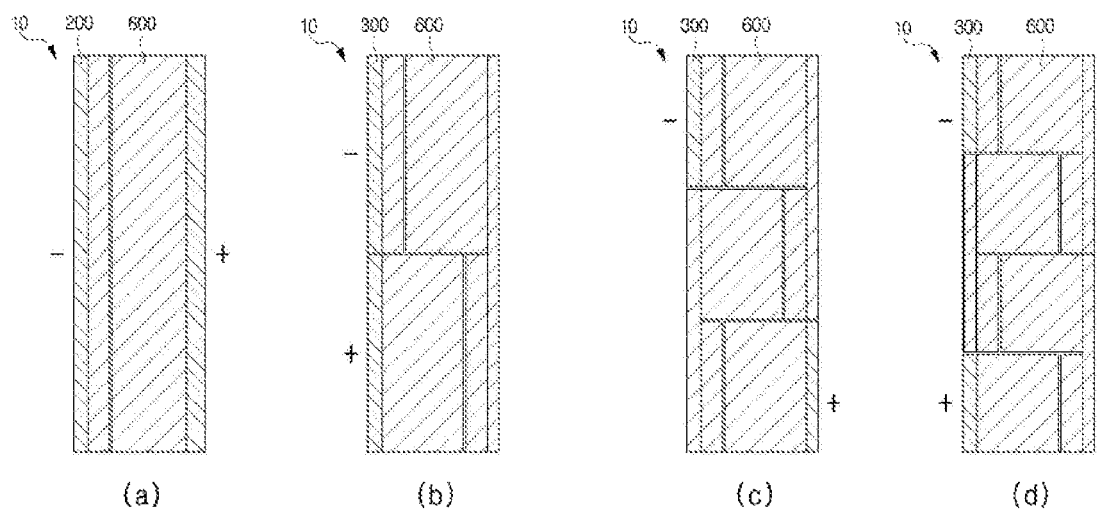

[Figure 5]
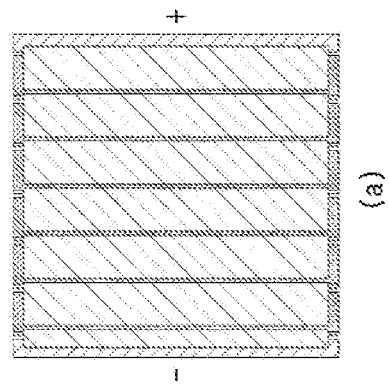
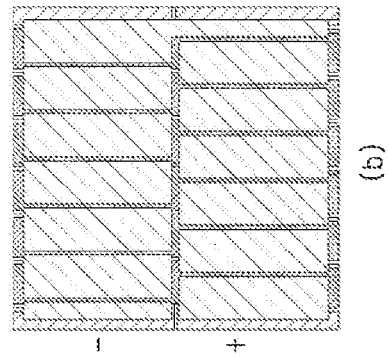
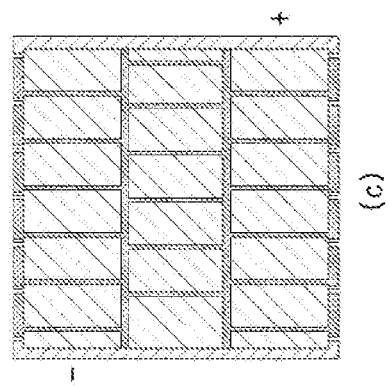
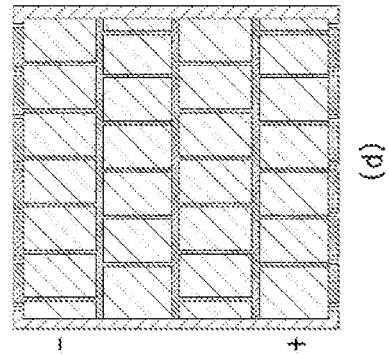

ORGANIC SOLAR CELL MODULE AND METHOD FOR MANUFACTURING SAME

This application is a National Stage Application of International Application No. PCT/KR2017/003347 filed on Mar. 28, 2017, which claims priority to and the benefit of Korean Patent Application No. 10-2016-0037174 filed in the Korean Intellectual Property Office on Mar. 28, 2016 and Korean Patent Application No. 10-2017-0038517 filed in the Korean Intellectual Property Office on Mar. 27, 2017, all of which are incorporated herein in their entirety by reference for all purposes as if fully set forth herein.

TECHNICAL FIELD

This application claims priority to and the benefit of Korean Patent Application No. 10-2016-0037174 filed in the Korean Intellectual Property Office on Mar. 28, 2016 and Korean Patent Application No. 10-2017-0038517 filed in the Korean Intellectual Property Office on Mar. 27, 2017, the entire contents of which are incorporated herein by reference.

The present invention relates to a manufacturing method of an organic solar cell module and an organic solar cell module, and more particularly, to an organic solar cell module and a manufacturing method thereof, in which lower electrodes are spaced apart and etched in a staggered pattern and upper electrodes are coated to correspond to the lower electrodes to reduce a photoactive area of a sub cell and arrange more sub cells than sub cells in the related art in a predetermined area.

Further, the present invention also relates to an organic solar cell module and a manufacturing method thereof, which can reduce the installation cost and the manufacturing cost by coating a buffer layer and a photoactive layer on the lower electrode etched in a staggered pattern using a slot die coating apparatus in the related art.

BACKGROUND ART

We have gained energy through fossil fuels such as petroleum, coal, and natural gas for 200 years. However, as problems such as depletion of fossil fuels and carbon dioxide emissions from the fossil fuel are emerging, researches on environmentally friendly and inexhaustible energy that can replace the fossil fuel are being conducted worldwide. The energy which will replace the fossil fuel includes new renewable energy used by converting the fuel fossil or used by converting renewable energy including sunshine, water, geothermal, precipitation, and bio-organisms.

A solar cell that produces electrical energy using sunlight which is one of the new renewable energy sources has a principle in which when sunlight in a wavelength range with larger energy than a forbidden bandwidth is incident on a semiconductor device composed of a PN junction, pairs of electrons and holes are excited by optical energy and electrons and holes separated by an internal electric field move, and an n layer and a p layer are thus charged to a cathode and an anode, respectively, and as a result, electromotive force is generated and current flows to a load which contacts the outside.

In Korean Patent Registration No. 10-1258185 regarding a solar cell module and a manufacturing method thereof, a plurality of cells is formed by sequentially stacking a first electrode unit, a charge transport layer, a photoactive layer, and a second electrode unit on a substrate to manufacture the solar cell module and a charge transport layer and an electrode layout structure of each cell are changed and stacked at the time of manufacturing the module to control total voltage, or a direction and a magnitude of current.

Further, in Korean Patent Unexamined Publication No. 10-2011-0035799, a plurality of cells including a rear electrode light absorbing layer, a buffer layer, and a front electrode layer is formed on one substrate and the formed cells are connected in series or in parallel to form output voltage.

However, the prior art as a technology regarding a solar cell module that controls the direction and the magnitude of the total voltage or current of the module through only a change in the number of strips constituting an individual module and a layout structure of the electrode has a problem in that a final module size is determined according to an organic solar cell module applied product and the width of a solar cell sub cell and the number of solar cell sub cells are limited in a predetermined area due to a limit in a coating technology, and as a result, the voltage magnitude varies.

Further, the prior art as a technology that manufactures solar cell module units by stacking the substrate, a rear electrode, the light absorbing layer, the buffer layer, and the front electrode layer and arranges and connects the respective manufactured solar cell module units in series or in parallel has a problem in that respective solar cell module units are manufactured in order to arrange one or more solar cell module units in a predetermined area and the same process is repeatedly executed, and as a result, a manufacturing process is inefficient.

Meanwhile, when the organic solar cell module in the related art is manufactured, the buffer layer and a photoactive layer are stacked using a slot die coating method, but therefore, lower and upper electrodes need to also be stacked in a stripe pattern and the organic solar cell module includes only a stripe-pattern sub cell. Therefore, the organic solar cell module has a problem in that the width of the stripe pattern and the number of stripe patterns are limited.

DETAILED DESCRIPTION OF THE INVENTION

Technical Problem

An object of the present invention is to provide a method in which first electrode materials coated on a substrate are etched in a staggered pattern to form one or more sub cell lower electrodes and second electrode materials are coated to correspond to the sub cell lower electrodes one to one to manufacture an organic solar cell module including one or more sub cells of which a photoactive area is reduced.

Further, another object of the present invention is to provide an organic solar cell module in which a lower electrode and an upper electrode are spaced apart from each other in a horizontal direction and a vertical direction, and as a result, the number of sub cells is twice or more with respect to the same area as compared with the related art and the sub cells are connected in series and, as a result, operating voltage thus increases twice or more as compared with the related art.

In addition, yet another object of the present invention is to provide an organic solar cell module including more sub cells than the related art and having reduced manufacturing cost by using a strip-type patterning process of coating the electrode, the buffer layer, and the photoactive layer in the related art.

Technical Solution

In order to solve the problem, a manufacturing method of an organic solar cell module according to the present invention may include: (a) a step of coating a first electrode material on the top of a substrate; (b) a step of forming one or more sub cell lower electrode units by etching the coated first electrode material in a staggered pattern; (c) a step of stripe-pattern coating a first buffer layer and a photoactive layer on the sub cell lower electrode unit; and (d) a step in which second electrode materials are coated on the photoactive layer to correspond to the one or more sub cell lower electrode units one to one.

Preferably, in step (b), in the etching in the staggered pattern, the first electrode material may be etched so that one or more horizontal lines are formed and the first electrode material may be etched so that vertical lines positioned above and below the one or more horizontal lines are staggered to each other.

Preferably, in step (b), the first electrode material may be etched to be partitioned into n (n is a natural number) in a horizontal direction and the first electrode material may be etched to be partitioned into n (n is the natural number) in a vertical direction, and as a result, one or more sub cell lower electrode units may be formed and the one or more sub cell lower electrode units may be formed to be spaced apart from each other.

Preferably, the first electrode material and the second electrode material may be coated by using at least one of solution coating, sputtering, vacuum thermal evaporation, atomic layer deposition, and chemical vapor deposition.

Preferably, in step (b), the etching in the staggered pattern may be performed by using at least one of photo-litho wet etching, laser etching, and scribing.

Preferably, in step (c), a first buffer layer and the photoactive layer may be coated by using at least one of vacuum deposition, spin-coating, bar-coating, slot-die coating, blade-coating, spray-coating, screen-printing, gravure offset printing, and inkjet printing.

Preferably, the manufacturing method of an organic solar cell module may further include a step of coating a second buffer layer on the photoactive layer between step (c) and step (d).

Further, an organic solar cell module according to the present invention may include: a substrate; one or more sub cell lower electrode units formed by etching first electrode materials on the substrate in a staggered pattern; a first buffer layer and a photoactive layer stripe-pattern coated on the one or more sub cell lower electrode units; and one or more sub cell upper electrode units formed by coating second electrode materials on the photoactive layer to correspond to the one or more sub cell lower electrode units one to one.

Preferably, the one or more sub cell lower electrode units may include one or more horizontal lines, and vertical lines positioned above and below the one or more horizontal lines, and the vertical lines may be staggered to each other.

Preferably, the one or more sub cell lower electrode units may be formed by etching the first electrode material to be partitioned into n (n is a natural number) in a horizontal direction and etching the first electrode material to be partitioned into n (n is the natural number) in a vertical direction.

Preferably, the one or more sub cell lower electrode units may be formed to be spaced apart from each other. Preferably, the organic solar cell module may further include a second buffer layer coated on the photoactive layer.

Preferably, the first buffer layer and the photoactive layer may be stripe-pattern coated by slot die coating.

Advantageous Effects

According to the present invention, there is an effect in which first electrode materials are etched so that one or more horizontal lines are formed and vertical lines positioned above and below one or more horizontal lines are etched to be staged to each other to form one or more sub cell lower electrodes and sub cell upper electrodes are coated to correspond to the sub cell lower electrodes one to one to simplify a manufacturing process, thereby efficiently manufacturing an organic solar cell module of which a total voltage value increases as compared with the related art.

In addition, the present invention has been made in an effort to provide a method that can manufacture an organic solar cell module in which the number of sub cells is not limited.

Further, there is an effect in which slot die coating is performed by using a manufacturing apparatus in the related art at the time of coating a first buffer layer and a photoactive layer to reduce installation cost of an organic solar cell module manufacturing apparatus and organic solar cell module manufacturing cost.

Moreover, there is an effect in which an organic solar cell module may be provided, in which more sub cells than those in the related art can be included in a predetermined area of the organic solar cell module, and as a result, a reaction area of the sub cell and short-circuit current (Jsc) are decreased and operating voltage, a fill factor (FF), efficiency, and open-circuit voltage (Voc) increase.

BRIEF DESCRIPTION OF DRAWINGS

FIG. 1 is a perspective view for describing a manufacturing method of an organic solar cell module 10 according to an embodiment of the present invention.

FIG. 2 is a plan view for describing the manufacturing method of an organic solar cell module 10 according to the embodiment of the present invention.

FIG. 3(*a*) is a perspective view of an organic solar cell module 10 according to an embodiment of the present invention and FIG. 3(*b*) is a plan view of the organic solar cell module 10 according to the embodiment of the present invention.

FIG. 4(*a*) is a plan view of an organic solar cell module 10 constituted by one sub cell and FIG. 4(*b*) is a plan view of an organic solar cell module 10 constituted by two sub cells. FIG. 4(*c*) is a plan view of an organic solar cell module 10 constituted by three sub cells and FIG. 4(*d*) is a plan view of an organic solar cell module 10 constituted by four sub cells.

FIG. 5 is a plan view for describing a difference in the number of sub cells between an organic solar cell module in the related art and an organic solar cell module according to another embodiment of the present invention in the same area, FIG. 5(*a*) is a plan view of the organic solar cell module in the related art, FIG. 5(*b*) is a plan view of an organic solar cell module according to a first embodiment of the present invention, FIG. 5(*c*) is a plan view of an organic solar cell module according to a second embodiment of the present invention, and FIG. 5(*d*) is a plan view of an organic solar cell module according to a third embodiment of the present invention.

BEST MODE

Hereinafter, preferred embodiments of an organic solar cell module according to an embodiment of the present invention and a manufacturing method thereof will be described with reference to the accompanying drawings. In this process, thicknesses of lines and sizes of constituent elements illustrated in the drawings, and the like may be exaggerated for clarity and ease of description. Further, terms to be described below, as terms which are defined in consideration of functions in the present invention may vary depending on the intention or custom of a user or an operator. Accordingly, definitions of the terms need to be described based on contents throughout this specification.

FIG. 1 is a perspective view for describing a manufacturing process of an organic solar cell module 10 according to an embodiment of the present invention and FIG. 2 is a plan view for describing the manufacturing method of an organic solar cell module 10 according to the embodiment of the present invention.

A manufacturing method of an organic solar cell module 10 according to an embodiment of the present invention may include: (a) a step of coating a first electrode material on the top of a substrate; (b) a step of forming one or more sub cell lower electrode units by etching the coated first electrode material in a staggered pattern; (c) a step of stripe-pattern coating a first buffer layer and a photoactive layer on the sub cell lower electrode unit; and (d) a step in which second electrode materials are coated on the photoactive layer to correspond to the one or more sub cell lower electrode units one to one. Hereinafter, the respective steps will be described in detail with reference to each drawing.

Step (a) is a step of coating a first electrode material 200 in advance in order to form a sub cell lower electrode unit 300 to be described below on a substrate 100.

Herein, the substrate 100 may include a glass substrate and a flexible substrate and the flexible substrate therebetween may include any one of PET, PEN, PI, and thin glass. However, it is noted that the substrate is a normal substrate used in the art and the type of substrate is not limited.

The first electrode material 200 may include at least one of ITO, silver nanowire, polyethylene dioxy thiophene (PEDOT:PSS), a metallic network, a carbon nano tube, a conductive polymer, and F-doped tin oxide (FTO)). Further, the first electrode material 200 is coated on the top of the substrate by using any one of solution coating, sputtering, vacuum heat deposition, atomic layer deposition, and chemical deposition.

Step (b) is a step in which the coated first electrode material 200 is etched in the staggered pattern to form one or more sub cell lower electrode units 300.

Herein, it is noted that the etching in the staggered pattern may be described as a process in which the first electrode material 200 is etched so that one or more horizontal lines are formed and the first electrode material 200 is etched or patterned so that vertical lines positioned at upper sides and lower sides of one or more horizontal lines are staged to each other.

As another form, it is noted that the etching in the staggered pattern may be described as a process in which the first electrode material 200 is etched to be partitioned into n (n is a natural number) in the horizontal direction and the first electrode material 200 is etched to be partitioned into n (n is the natural number) in the vertical direction to form one or more sub cell lower electrode units 300 and one or more sub cell lower electrode units 300 are formed to be spaced apart from each other.

The first electrode materials 200 are spaced apart from each other by the horizontal etching and the vertical etching, and as a result, the sub cell lower electrode unit 300 may be constituted by first to sixth sub cell lower electrodes 310, 320, 330, 340, 350, and 360.

For example, when the first electrode material 200 is etched so as to form one horizontal line in the first electrode material 200, the first electrode material 200 is partitioned into two and a spacing distance from one end of the first electrode material 200 may be differently formed in order to prevent vertical lines formed above the horizontal line and the vertical lines formed below the horizontal line from being positioned on the same line. That is, the fourth sub cell lower electrode 340 may be formed to be staggered to a right side or a left side of the first sub cell lower electrode 310.

Furthermore, referring to FIG. 2(b), a positional relationship of the vertical lines positioned above and below the horizontal line may be verified.

Therefore, two sub cell lower electrode units 300 may be formed and when two horizontal lines are formed by the same method, three sub cell lower electrode units 300 may be formed and when three horizontal lines are formed, four sub cell lower electrode units 300 may be formed. That is, when the sub cell lower electrode unit 300 is formed by the etching in the staggered pattern, there may be effect in which the sub cell lower electrode unit 300 may be formed without the limit in thickness and number.

Further, when the number of sub cell lower electrode units 300 is controlled by the etching in the staggered pattern, the number of sub cells of the organic solar cell module 10 may be consequently controlled. This will be described in detail with reference to FIG. 3 to be described below.

Furthermore, in step (b), the first electrode material 200 is etched by using at least one of photo-litho wet etching, laser etching, and scribing to form the sub cell lower electrode unit 300.

For example, in the case of an etching pattern of the sub cell lower electrode unit 300, the vertical line above the horizontal line may be etched to move to the left side and the vertical line below the horizontal line may be etched to move to the right side.

In more detail, when viewed based on a stripe pattern of the first buffer layer 400 and the photoactive layer 500 to be described below, the sub cell lower electrode unit 300 may be formed to be etched in such a manner that the second sub cell lower electrode 320 positioned above the horizontal line is shifted to the left side of the stripe pattern so that a left edge of the second sub cell lower electrode 320 is exposed and the fifth sub cell lower electrode 350 positioned below the horizontal line is shifted to the right side of the stripe pattern so that a right edge of the fifth sub cell lower electrode 350 is exposed.

Step (c) is a step in which the first buffer layer 400 and the photoactive layer 500 are coated onto the sub cell lower electrode unit 300 in the stripe pattern.

Herein, in the strip-pattern coating, since a slot die coating method in the related art is used, a manufacturing apparatus need not be replaced in order to manufacture the organic solar cell module 10 according to the present invention and since a manufacturing apparatus in the related art is used, manufacturing cost of the organic solar cell module 10 may be reduced.

Furthermore, the first buffer layer 400 and the photoactive layer 500 may be coated by using at least one of vacuum deposition, spin-coating, bar-coating, blade-coating, spray-coating, screen-printing, gravure off-set printing, and inkjet printing in addition to the slot die coating, but if the coating method includes a coating method used in the art, the coating method is not limited.

Moreover, the first buffer layer 400 may include at least one of VOx, MoOx, NiO, WO3, PEI, PEIE, PAA, ZnO, ZnO, TiO2, and TiOx and the photoactive layer 500 may include at least one of P3HT, PTB7, PCE-10, low molecular organic compound, PC61BM, PC71BM, and ICBA, but if the layers include compositions used in the art, the compositions are not limited.

In step (c), the first buffer layer 400 and the photoactive layer 500 may be integrally formed so as to penetrate the sub cell lower electrode unit 300 spaced by the horizontal line. Further, the first buffer layer 400 may be coated between the vertical lines formed in the sub cell lower electrode unit 300. In this case, the first buffer layer 400 may be coated to be spaced apart from the right edge of the second sub cell lower electrode 320 or the left edge of the fifth sub cell lower electrode 350 so as to prevent the vertical line from being completely covered.

In more detail, while the sub cell lower electrode unit 300 above the horizontal line moves to the right side from a first vertical line based on the left side, the first buffer layer 400 may be coated. Furthermore, an area of the first buffer layer 400 coated between the vertical lines is a range to cover the right edge of the second sub cell lower electrode 320 and not to completely cover a second vertical line and if the area satisfies the range, the area of the first buffer layer 400 coated between the vertical lines is not limited. Further, a second sub cell upper electrode 620 to be described below and the second sub cell lower electrode 320 may be formed so as not to directly contact each other.

By the same principle, while the sub cell lower electrode unit 300 below the horizontal line moves to the left side from the second vertical line based on the left side, the first buffer layer 400 may be coated. Furthermore, a range of the area of the first buffer layer 400 coated between the vertical lines is a range to cover the left edge of the fifth sub cell lower electrode 350 and not to completely cover the first vertical line, the area of the first buffer layer 400 coated between the vertical lines is not limited. A third sub cell upper electrode 630 to be described below and the fifth sub cell lower electrode 350 may be formed so as not to directly contact each other.

Therefore, the second and fifth sub cell lower electrodes 320 and 350 serving as an electron transfer path and the second and third sub cell upper electrodes 620 and 630 serving as a hole transfer path do not directly contact each other to prevent a short circuit which occurs as the electrons and the holes separated in the photoactive layer 500 meet again.

Moreover, the first buffer layer 400 and the photoactive layer 500 are coated in the stripe pattern without separate patterning to manufacture (the number of stripes)×(the number of horizontal lines+1) sub cells.

Step (d) is a step in which second electrode materials are coated onto the photoactive layer 500 to correspond to one or more sub cell lower electrode units 300 one to one.

Further, the second electrode materials are coated to correspond to one or more sub cell lower electrode units 300 one to one to form a sub cell upper electrode unit 600 and the sub cell upper electrode unit 600 may be constituted by first to fourth sub cell upper electrodes 610, 620, 630, and 640.

Herein, one-to-one correspondence coating may mean coating the second electrode material so as to form the horizontal line at the same position as the horizontal line formed in the first electrode material 200 when the first electrode material 200 is partitioned into n (n is the natural number) and two or more sub cell lower electrode units 300 are thus formed.

In more detail, when the second electrode material is coated, the horizontal line and the vertical line may be formed and the horizontal line of the second electrode material may be formed at the position corresponding to the horizontal line formed in the first electrode material 200 and the second electrode materials may be staggered to the right side and the left side of the photoactive layer 500.

Further, two second electrode materials which are staggered to the right side and the left side of the photoactive layer 500 may be formed to be spaced apart from each other and the vertical line of the second electrode material may be formed between two vertical lines formed in the first electrode material 200. That is, the vertical lines formed in the second electrode material of a number may be formed, which is different from the number of vertical lines formed in the first electrode material 200.

In more detail, the second sub cell upper electrode 620 is coated while moving to the right side of the photoactive layer 500 to be coated on the tops of the photoactive layer 500 and the third sub cell lower electrode 330 to serve as a bridge that conducts the holes separated in the photoactive layer 500 to an upper stripe electrode unit 700 to be described below.

By the same principle, the third sub cell upper electrode 630 is coated while moving to the left side of the photoactive layer 500 to be coated on the tops of the photoactive layer 500 and the fourth sub cell lower electrode 340 to serve as a bridge that conducts the holes separated in the photoactive layer 500 to the fourth sub cell lower electrode 340.

Furthermore, the first sub cell upper electrode 610 is coated on the tops of two lower electrodes 310 and 320 so as to connect the first sub cell lower electrode 310 and the second sub cell lower electrode 320 to serve as a bridge that conducts the electrons separated in the photoactive layer 500 from the second sub cell lower electrode 320 to the first sub cell lower electrode 310.

By the same principle, the fourth sub cell upper electrode 640 is coated on the tops of two lower electrodes 350 and 360 so as to connect the fifth sub cell lower electrode 350 and the sixth sub cell lower electrode 360 to conduct the electrons separated in the photoactive layer 500 from the fifth sub cell lower electrode 350 to the sixth sub cell lower electrode 360.

Referring to FIG. 2(d), the positional relationship of the horizontal line and the vertical line formed in the second electrode material may be verified.

Meanwhile, the second electrode material may include at least one of a transparent electrode, silver (Ag), aluminum (Al), gold (Au), platinum (Pt), tungsten (W), copper (Cu), calcium (Ca), and magnesium (Mg). However, if the second electrode material includes the compositions used in the art, the second electrode material is not limited.

In addition, since the coating method of the second electrode material is the same as the coating method of the first electrode material 200 coated in step (a), a detailed description thereof will be omitted.

Further, as the method for forming the horizontal line and the vertical line in the second electrode material, at least one of masking, photo-litho wet etching, laser etching, and scribing may be used in addition to the aforementioned coating, but if a technique that may form the second electrode materials to be spaced apart from each other includes etching techniques used in the art, the technique is not limited.

Meanwhile, the manufacturing method of the organic solar cell module 10 may further include a step of stripe-coating the second electrode material onto the right edge of the organic solar cell module 10. It is noted that the second electrode material is stripe-coated to form the upper stripe electrode unit 700 and a plurality of sub cell upper electrode units 600 formed above and below the horizontal line are connected in series to conduct the electrons to the organic solar cell module 10.

On the contrary, it is noted that in the step of forming one or more sub cell lower electrode units 300 by etching the first electrode materials in the staggered pattern, when the horizontal line is not formed up to a right end and the third sub cell lower electrode 330 and the sixth sub cell lower electrode 360 are connected, the step of forming the upper stripe electrode unit 700 may be omitted.

The manufacturing method of the organic solar cell module 10 may further include a step of coating a second buffer layer onto the photoactive layer 500 between steps (c) and (d) and the coating method and the material of the second buffer layer are the same as the coating method and the material of the first buffer layer 400 and on the other hand, since coating is also available by deposition through the known technique in the second buffer layer, the detailed description thereof will be omitted.

Meanwhile, FIG. 3 is a diagram illustrating an organic solar cell module 10 in which the sub cell lower electrode unit 300 is made of a cathode material and the sub cell upper electrode unit 600 is made of an anode material. In this case, the organic solar cell module 10 may be an inverted structure and the first buffer layer 400 may serve as an electron transport layer and the second buffer layer may serve as a hole transport layer.

Furthermore, when the sub cell lower electrode unit 300 is made of the anode material and the sub cell upper electrode unit 600 is made of the cathode material, the organic solar cell module 10 has a normal structure. In this case, the first buffer layer 400 may serve as the hole transport layer and the second buffer layer may serve as the electron transport layer.

FIG. 3(a) is a perspective view of an organic solar cell module 10 according to an embodiment of the present invention and FIG. 3(b) is a plan view of the organic solar cell module 10 according to the embodiment of the present invention. The organic solar cell module 10 generated by the manufacturing method of the organic solar cell module 10 according to the embodiment of the present invention may include a substrate 10, one or more sub cell lower electrode units 300 in which first electrode materials 200 are etched on the substrate 10 in the staggered pattern, a first buffer layer 400 and a photoactive layer 500 which are coated on one or more sub cell lower electrode units 300 in a stripe pattern, and one or more sub cell upper electrode units 600 in which second electrode materials are coated on the photoactive layer 500 to correspond to one or more sub cell lower electrode units 300 one to one.

One or more sub cell lower electrode units 300 may include one or more horizontal lines and vertical lines positioned above and below one or more horizontal lines and the vertical lines may be formed to be staggered to each other.

In more detail, the first electrode material 200 may be etched to be partitioned into n (n is the natural number) in the horizontal direction and the first electrode material 200 may be etched to be partitioned into n (n is the natural number) in the vertical direction and one or more sub cell lower electrode units 300 may be spaced apart from each other.

Further, the organic solar cell module 10 may further a second buffer layer coated on the photoactive layer 500.

Moreover, the first buffer layer 400 and the photoactive layer 500 may be coated in the stripe pattern by slot die coating. Furthermore, the photoactive layer 500 may be formed in any one structure of a structure including a donor layer and an acceptor layer, a composite thin-film structure, and a composite structure in which a composite thin film is configured between the donor layer and the acceptor layer.

Since the organic solar cell module 10 has the same advantage and effect as the aforementioned configuration, the detailed description thereof will be omitted.

FIG. 4(a) is a plan view illustrating an organic solar cell module 10 formed by using the related art and FIGS. 4(b), 4(c), and 4(d) are plan views illustrating an organic solar cell module 10 formed when first electrode materials 200 are etched in the staggered pattern.

Among them, FIG. 4(b) is a plan view for describing an organic solar cell module 10 including two sub cells and two sub cell lower electrode units 300 are formed by etching in the staggered pattern and the sub cell upper electrode unit 600 is spaced and coated so as to have the same positions and number of the horizontal lines as the sub cell lower electrode unit 300, and as a result, two sub cell upper electrode units 600 may also be formed.

Additionally, FIG. 4(c) is a plan view for describing an organic solar cell module 10 including three sub cells as two horizontal lines are formed by the etching in the staggered pattern to form three sub cell lower electrode units 300 and sub cell upper electrode units 600. Additionally, FIG. 4(d) is a plan view for describing an organic solar cell module 10 including four sub cells as three horizontal lines are formed to form four sub cell lower electrode units 300 and sub cell upper electrode units 600.

Therefore, two or more sub cell lower electrode units 300 are formed by the etching in the staggered pattern and the sub cell upper electrode unit 600 is coated to correspond to the sub cell lower electrode unit 300, and as a result, the number of sub cells of FIGS. 4(b), 4(c), and 4(d) may be controlled to the multiple of the number of stripe patterns of FIG. 4(a), thereby controlling a current value and a voltage value.

That is, the total voltage of FIG. 4(a) may be controlled to Vtotal=V1, the total voltage of FIG. 4(b) may be controlled to Vtotal=V1+V2, the total voltage of FIG. 4(c) may be controlled to Vtotal=V1+V2+V3, and the total voltage of FIG. 4(d) may be controlled to Vtotal=V1+V2+V3+V4.

Further, an active area of each sub cell is reduced as compared with the related art, and as a result, operating voltage, a fill factor (FF), open-circuit voltage (Voc), and power conversion efficiency are increased and short-circuit current (Jsc) is decreased, thereby increasing performance of the organic solar cell module 10. Further, the positions of a positive (+) electrode and a negative (−) electrode of the organic solar cell module including one or more sub cells may also be controlled to change a direction of optical current.

Meanwhile, in FIGS. 4(b), 4(c), and 4(d), the positions of the positive (+) electrode and the negative (−) electrode of the organic solar cell module 10 having the inverted structure are displayed. Therefore, when the organic solar cell module 10 has the normal structure, it is noted that the positions of the positive (+) electrode and the negative (−) electrode of the organic solar cell module 10 may be formed opposite to positions of the positive (+) electrode and the negative (−) electrode of the organic solar cell module having the inverted structure.

FIG. 5 is a plan view for describing a difference in the number of sub cells between an organic solar cell module in the related art and an organic solar cell module 10 according to another embodiment of the present invention in the same area, FIG. 5(a) is a plan view of the organic solar cell module in the related art and FIG. 5(b) is a plan view of an organic solar cell module 10 according to another embodiment of the present invention.

EXPERIMENTAL EXAMPLE

Performances of the organic solar cell module manufactured by using the related art and the organic solar cell module in which etching in a staggered pattern and one or more horizontal lines are formed according to the embodiment of the present invention were measured and compared.

To this end, an experiment was performed with respect to one organic solar cell module product manufactured without the etching in the staggered pattern and the horizontal line by using the related art with a size of 9 cm×9 cm and three organic solar cell module products according to the embodiment of the present invention.

A comparative example is an organic solar cell module having a size of 9 cm×9 cm, which is constituted by 6 sub cells and ITO is coated on a PET substrate and ITO is etched only in the vertical direction. The electron transport layer, the photoactive layer, and the hole transport layer were coated on the etched ITO in order by using the slot die coating and bipolar metal was coated on the hole transport layer in the stripe pattern, and as a result, the organic solar cell module was manufactured.

In addition, in the first, second, and third embodiments, according to the manufacturing method of the organic solar cell module according to the present invention, ITO is coated on the PET substrate, the coated ITO is etched so as to form one horizontal line, and the vertical lines positioned above and below the horizontal line are etched to be staged to each other to pattern the ITO. The electron transport layer, the photoactive layer, and the hole transport layer were coated on the patterned ITO in order by using the slot die coating and the bipolar metal was coated on the hole transport layer to correspond to the patterned ITO one to one, and as a result, the organic solar cell module was manufactured.

The first, second, and the third embodiments illustrate the organic solar cell modules having the size of 9 cm×9 cm, which are constituted by 12, 18, and 24 sub cells, respectively.

In this case, the performance measurement includes Voc, Jsc, current density (Vmp), voltage value (Jmp), Avg, Voc/cell, and Jsc/cell. Efficiency η of the organic solar cell module may be calculated by using Voc, Jsc, and FF.

Conditions such as a tool, a reagent, equipment, and a method for measuring the performance are the same.

DETAILED EXAMINATION

Referring to the above table, it can be seen that as a result of measuring the performances of the organic solar cell module according to the comparative example and the organic solar cell module according to the first to third embodiments, increased widths of the fill factor (FF), Avg, and Voc/cell were slight, but Voc shows difference of 2 times, 3 times, and 4 times. That is, it can be seen that a Voc value increases in proportion to the number of sub cells in the same area.

Further, it can be seen that a Jsc value decreases in proportion to the number of sub cells.

The efficiency η is a value which may be acquired by an equation $$\eta = \frac{JscVocFF}{Pin}$$

and Voc and Jsc of the comparative example and the first to third embodiments were measured by similarly setting the intensity (Pin) of incident light at the time of measuring Voc and Jsc. It can be seen that the Jsc values of the first to third embodiments decrease as compared with the Jsc value of the comparative example, but the Voc and FF values increase, and as a result, the efficiency increases.

Accordingly, it can be seen that the organic solar cell module according to the present invention has an effect in that as the Voc and FF values increase, the efficiency and the performance increase.

The present invention has been described with reference to the preferred embodiments. However, it will be appreciated by those skilled in the art that various modifications and changes of the present invention can be made without departing from the spirit and the scope of the present invention which are defined in the appended claims.

The invention claimed is:

1. A manufacturing method of an organic solar cell module, comprising:
   (a) a step of coating a first electrode material on the top of a substrate;
   (b) a step of forming one or more sub cell lower electrode units by etching the coated first electrode material in a staggered pattern;
   (c) a step of stripe-pattern coating a first buffer layer and a photoactive layer on the sub cell lower electrode unit; and
   (d) a step of coating second electrode materials on the photoactive layer to correspond to one or more sub cell lower electrode units one to one.

2. The manufacturing method of an organic solar cell module of claim 1, wherein in step (b), in the etching in the staggered pattern, the first electrode material is etched so that one or more horizontal lines are formed and the first

TABLE 1

| # of rows (6-stripe module) | Voc | Jsc (mA/cm$^2$) | FF | η (%) | Avg Voc/cell (V) | Jsc/cell (mA/cm$^2$) |
|---|---|---|---|---|---|---|
| Comparative Example | 5.385 | 1.730 | 0.378 | 3.52 | 0.897 | 10.381 |
| First Embodiment | 10.652 | 0.844 | 0.399 | 3.59 | 0.888 | 10.124 |
| Second Embodiment | 14.718 | 0.580 | 0.419 | 3.58 | 0.818 | 10.449 |
| Third Embodiment | 19.463 | 0.421 | 0.453 | 3.71 | 0.811 | 10.115 | electrode material is etched so that vertical lines positioned above and below the one or more horizontal lines are staggered to each other.

3. The manufacturing method of an organic solar cell module of claim 1, wherein in step (b), the first electrode material is etched to be partitioned into n (n is a natural number) in a horizontal direction and the first electrode material is etched to be partitioned into n (n is the natural number) in a vertical direction, and as a result, one or more sub cell lower electrode units are formed and the one or more sub cell lower electrode units are formed to be spaced apart from each other.

4. The manufacturing method of an organic solar cell module of claim 1, wherein the first electrode material and the second electrode material are coated by using at least one of solution coating, sputtering, vacuum thermal evaporation, atomic layer deposition, and chemical vapor deposition.

5. The manufacturing method of an organic solar cell module of claim 1, wherein in step (b), the etching in the staggered pattern is performed by using at least one of photo-litho wet etching, laser etching, and scribing.

6. The manufacturing method of an organic solar cell module of claim 1, wherein in step (c), a first buffer layer and the photoactive layer are coated by using at least one of vacuum deposition, spin-coating, bar-coating, slot-die coating, blade-coating, spraycoating, screen-printing, gravure off-set printing, and inkjet printing.

7. The manufacturing method of an organic solar cell module of claim 1, further comprising:
   between step (c) and step (d),
   a step of coating a second buffer layer on the photoactive layer.

8. The manufacturing method of an organic solar cell module of claim 1, further comprising:
   a step of stripe-coating the second electrode material at a right edge of the organic solar cell module.

9. An organic solar cell module manufactured by claim 1.

* * * * *